(12) United States Patent
Yeom et al.

(10) Patent No.: US 9,871,045 B2
(45) Date of Patent: Jan. 16, 2018

(54) SEMICONDUCTOR DEVICE WITH DAMASCENE BIT LINE AND METHOD FOR MANUFACTURING THE SAME

(75) Inventors: Seung-Jin Yeom, Gyeonggi-do (KR); Noh-Jung Kwak, Gyeonggi-do (KR); Chang-Heon Park, Gyeonggi-do (KR); Sun-Hwan Hwang, Gyeonggi-do (KR)

(73) Assignee: HYNIX SEMICONDUCTOR INC., Gyeonggi-do (KR)

( * ) Notice: Subject to any disclaimer, the term of this patent is extended or adjusted under 35 U.S.C. 154(b) by 585 days.

(21) Appl. No.: 13/334,000

(22) Filed: Dec. 21, 2011

(65) Prior Publication Data

US 2013/0049209 A1 Feb. 28, 2013

(30) Foreign Application Priority Data

Aug. 29, 2011 (KR) .......................... 10-2011-0086762

(51) Int. Cl.
*H01L 21/768* (2006.01)
*H01L 27/108* (2006.01)

(52) U.S. Cl.
CPC .. *H01L 27/10855* (2013.01); *H01L 27/10885* (2013.01)

(58) Field of Classification Search
CPC ....................................................... H01L 21/768
USPC ........................................................... 257/773
See application file for complete search history.

(56) References Cited

U.S. PATENT DOCUMENTS

| 2008/0067678 A1* | 3/2008 | Kim ............................... 257/750 |
| 2008/0067692 A1* | 3/2008 | Kim et al. .................... 257/774 |
| 2008/0290390 A1* | 11/2008 | Cha ............................... 257/306 |
| 2010/0105169 A1* | 4/2010 | Lee .................... H01L 21/76898 438/107 |

* cited by examiner

*Primary Examiner* — Kenneth Parker
*Assistant Examiner* — Christopher Culbert
(74) *Attorney, Agent, or Firm* — IP & T Group LLP

(57) ABSTRACT

A semiconductor device includes first conductive patterns adjacent to each other and isolated by a trench including first and second trenches, a second conductive pattern formed in the first trench, and an insulating pattern partially filling the second trench under the second conductive pattern and formed between the first conductive patterns and the second conductive pattern.

19 Claims, 9 Drawing Sheets

SEMICONDUCTOR DEVICE WITH DAMASCENE BIT LINE AND METHOD FOR MANUFACTURING THE SAME

CROSS-REFERENCE TO RELATED APPLICATIONS

The present application claims priority of Korean Patent Application No. 10-2011-0086762, filed on Aug. 29, 2011, which is incorporated herein by reference in its entirety.

BACKGROUND

1. Field

Exemplary embodiments of the present invention relate to a method for manufacturing a semiconductor device, and more particularly, to a semiconductor device which is capable of decreasing capacitance between a bit line and a storage node contact plug, and a method for manufacturing the same.

2. Description of the Related Art

Recently, as the degree of integration of a memory device increases, it may be considerably difficult to form a self-aligned contact (SAC) for a storage node contact plug (SNC) after forming a bit line with a stack structure. In a memory device of a 30 nm level or below, as a process margin decreases in such a way, the open area of a storage node contact hole may not be secured to thereby cause an SAC fail.

In order to cope with the features, a damascene bit line process has been introduced wherein, the damascene bit line process, a storage node contact plug is formed first and a bit line is then formed.

Specifically, in the damascene bit line process, two adjacent storage node contact plugs are formed to join together and are subsequently separated from each other through a damascene process. Thereafter, a bit line is formed to fill the inside of a damascene pattern. Due to this process, patterning may be easily performed in comparison with the case in which storage node contact plugs are individually formed. Also, there may be an advantage in terms of occurrence of an SAC fail in comparison with a process for subsequently forming the storage node contact plugs.

FIG. 1A is a cross-sectional view illustrating a conventional semiconductor device with a damascene bit line.

Referring to FIG. 1A, a plurality of active regions 13 are delimited by an isolation layer 12 in a semiconductor substrate 11. The respective active regions 13 are defined with bit line contact regions and storage node contact regions. Storage node contact plugs 15A and 15B are formed in the storage node contact regions of the active regions 13. Bit lines 16 are formed in the bit line contact regions of the active regions 13. The bit lines 16 are formed by being filled in the spaces defined between adjacent storage node contact plugs 15A and 15B (which are referred to as damascene patterns), and therefore, serve as damascene bit lines. Bit line spacers 17 are formed on both sidewalls of the bit lines 16 and on both sidewalls of the storage node contact plugs 15A and 15B. Further, bit line spacers 17 are formed between the storage node contact plugs 15A and 15B and the bit lines 16. The reference numeral 14 designates an interlayer dielectric or insulating layer, and the reference numeral 18 designates a bit line hard mask layer.

In the conventional semiconductor device constructed as described above, under the condition that the critical dimension (CD) of the bit line 16 is limited, bit line resistance (sheet resistance of a bit line per unit cell) and total bit line capacitance, that are in a trade-off relationship with respect to each other, should be simultaneously satisfied. However, in a semiconductor device of a 20 nm level or below, it may be difficult to simultaneously acquire two desirable values thereof.

In the structure mentioned above, in order to electrically completely isolate adjacent active regions 13, the bit lines 16 should have a depth that completely separates the storage node contact plugs 15A and 15B. Thus, when forming the damascene patterns for the bit lines 16, a portion of the isolation layer 12 should be etched as well. In this regard, if the critical dimension of the bit lines 16 increases, a contact resistance may increase since the contact area between the active regions 13 and the storage node contact plugs 15A and 15B may decrease. Therefore, considering overlay and CD variation, a securable CD of the bit lines 16 may further decrease.

FIG. 1B is a graph illustrating a relationship between bit line capacitance and bit line resistance depending upon a critical dimension difference in the conventional art. FIG. 1C is a perspective view illustrating the overlap area between a bit line and a storage node contact plug in the conventional art.

When describing a structural aspect with reference to FIG. 1B, if the critical dimension of the bit line 16 decreases (CD2>CD1, see ① of FIG. 1B), in order to obtain bit line resistance $BL_{Rs}$ of a predetermined level, the height of the bit line 16 (a final bit line height after etch-back) should be increased. However, if the final bit line height is increased, an area (hereinafter, referred to as an 'overlap area') 100 (see FIG. 1C), through which the storage node contact plug 15B and the bit line 16 face each other, increases at the same rate. As a result, capacitance $BL_C$ between the bit line 16 and the storage node contact plug 15 may increases (see ② of FIG. 1B).

In an aspect of substance, development of a substance with low specific resistance as a metal layer used to form the bit line 16 is demanded, and a substance with a low dielectric constant is needed for the bit line spacers 17. In this regard, even when applying, to the spacers, a low resistance titanium nitride layer (TiN), a low resistance tungsten layer W and an oxide layer which have been developed so far, it may be difficult to satisfy the two properties described above.

SUMMARY

Exemplary embodiments of the present invention are directed to a semiconductor device which is capable of decreasing capacitance between a bit line and a storage node contact plug without loss of bit line resistance, and a method for manufacturing the same.

In accordance with an exemplary embodiment of the present invention, a semiconductor device includes first conductive patterns adjacent to each other and isolated by a trench including first and second trenches, a second conductive pattern formed in the first trench, and an insulating pattern partially filling the second trench under the second conductive pattern and formed between the first conductive patterns and the second conductive pattern.

In accordance with another exemplary embodiment of the present invention, a semiconductor device includes a plurality of adjacent plugs isolated by a trench including first and second trenches, a bit line formed in the first trench, and an insulating layer partially filling the second trench under the bit line and formed between the plugs and the bit line.

In accordance with another exemplary embodiment of the present invention, a semiconductor device includes an isolation layer isolating adjacent active regions, storage node contact plugs formed over the active regions and isolated by a trench including first and second trenches, an insulating layer partially filling the first trench and formed on sidewalls of the storage node contact plugs, and a bit line partially filling the second trench over the insulating layer.

In accordance with another exemplary embodiment of the present invention, a semiconductor device includes an isolation layer isolating adjacent active regions, storage node contact plugs formed over the active regions and isolated by first and second trenches wherein the second trench is defined under the first trench and has a critical dimension gradually decreasing toward a bottom thereof, an insulating layer gap-filling the second trench and formed on sidewalls of the storage node contact plugs, and a bit line partially filling the first trench.

In accordance with yet another exemplary embodiment of the present invention, a method for manufacturing a semiconductor device includes: forming a preliminary first conductive pattern over a semiconductor substrate, etching the preliminary first conductive pattern and thereby forming first conductive patterns which are isolated by a trench comprising first and second trenches, wherein is defined under the first trench and has a critical dimension smaller than that of the first trench, forming an insulating layer which gap-fills the second trench and is disposed on sidewalls of the first trench, and forming a second conductive pattern which partially fills the first trench.

DETAILED DESCRIPTION

Figure 1A:
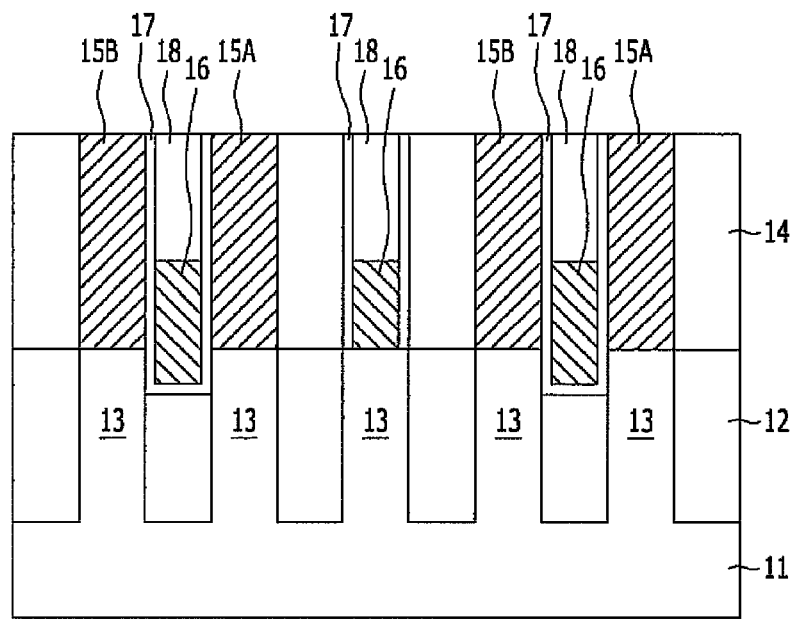
FIG. 1A is a cross-sectional view illustrating a conventional semiconductor device with a damascene bit line.
Figure 1B:
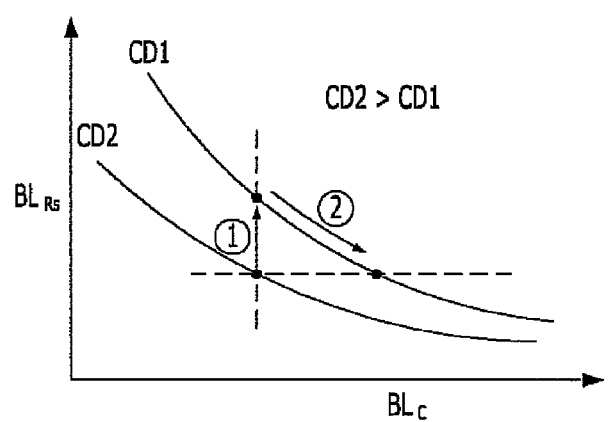
FIG. 1B is a graph illustrating a relationship between bit line capacitance and bit line resistance depending upon a critical dimension difference in the conventional art.
Figure 1C:
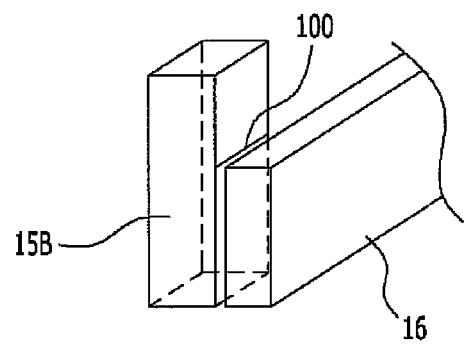
FIG. 1C is a perspective view illustrating the overlap area between a bit line and a storage node contact plug in the conventional art.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
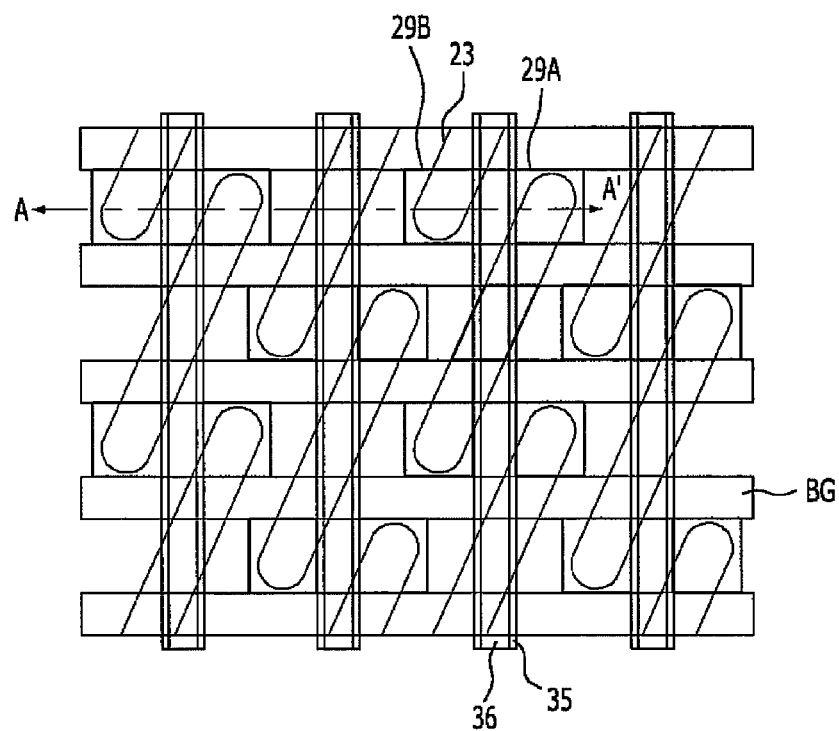
FIG. 2A is a plan view illustrating a semiconductor device in accordance with a first exemplary embodiment of the present invention.
Figure 2B:
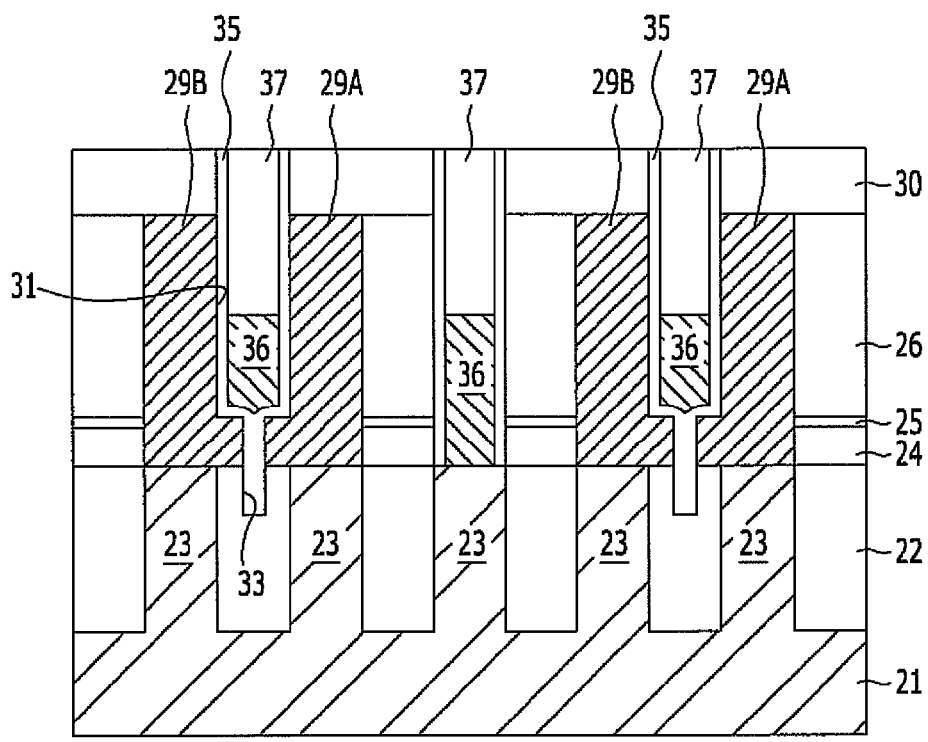
FIG. 2B is a cross-sectional view taken along the line A-A' of FIG. 2A.

FIG. 2A is a plan view illustrating a semiconductor device in accordance with a first exemplary embodiment of the present invention, and FIG. 2B is a cross-sectional view taken along the line A-A' of FIG. 2A.

Referring to FIGS. 2A and 2B, an isolation layer 22 is formed in a semiconductor substrate 21. Active regions 23 are defined by the isolation layer 22. Storage node contact plugs 29A and 29B are formed in the storage node contact regions of the active regions 23. Bit lines 36 are formed in the bit line contact regions of the active regions 23. The storage node contact plugs 29A and 29B are separated by the bit lines 36. The bit lines 36 are formed in such a way as to be filled in damascene patterns which are formed by etching a first interlayer dielectric or insulating layer 24, an etch stop layer 25 and a second interlayer insulating layer 26. Therefore, the bit lines 36 are referred to as damascene bit lines. Preliminary storage node contact plugs are divided by the damascene patterns into the individual storage node contact plugs 29A and 29B.

The damascene patterns for division into the storage node contact plugs 29A and 29B have a two-staged trench structure which is constituted by a first trench 31 and a second trench 33. The critical dimension of the second trench 33 is smaller than that of the first trench 31. The bit lines 36 are formed in first trenches 31, and bit line spacers 35 are filled in second trenches 33. A bit line hard mask layer 37 is formed on the bit lines 36. The bit line spacers 35 are formed between the bit lines 36 and the storage node contact plugs 29A and 29B. The bit line spacers 35 include a nitride layer such as a silicon nitride layer. The storage node contact plugs 29A and 29B include a polysilicon layer. Hard mask layer patterns 30 are formed on the storage node contact plugs 29A and 29B and the second interlayer insulating layer 26. The reference symbol BG shown in FIG. 2A designates buried gates.

As described above, the bit line spacers 35 are deposited between the storage node contact plugs 29A and 29B and the bit lines 36. That is, the bit line spacers 35 gap-fill the second trenches 33 and are formed on the sidewalls of the first trenches 31.

Figure 2C:
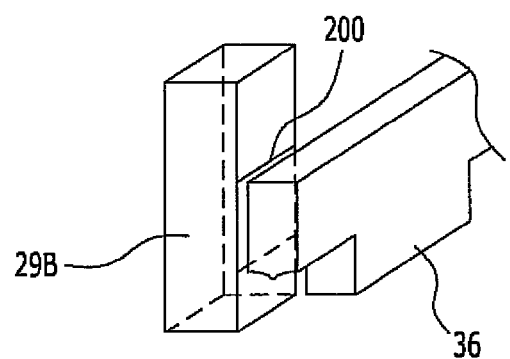
FIG. 2C is a perspective view illustrating the overlap area between a bit line and a storage node contact plug in accordance with the first exemplary embodiment of the present invention.

FIG. 2C is a perspective view illustrating the overlap area between a bit line and a storage node contact plug in accordance with the first exemplary embodiment of the present invention.

Referring to FIG. 2C, since the bit line spacers 35 are filled in the second trenches 33, an overlap area 200 decreases, wherein the overlap area 200 represents an area where the storage node contact plugs 29A and 29B and the bit lines 36 face each other. For example, because the bit line spacers 35 are filled in the second trenches 33 and bit lines 36 is not deposited in the second trenches 33, the overlap area 200 between the storage node contact plugs 29A and 29B and the bit lines 36 decreases.

As a consequence, in the first exemplary embodiment of the present invention, even when the critical dimension of the bit lines 36 decreases and the height of the bit lines 36 is increased to secure bit line resistance, since the bit line spacers 35 made of a dielectric (insulating) substance are filled in the second trenches 33 and the bit lines 36 is not formed in the second trenches 33, the overlap area 200 between the storage node contact plugs 29A and 29B and the bit lines 36 decreases. Thus, capacitance between the storage node contact plugs 29A and 29B and the bit lines 36 may be decreased.

Moreover, in the first exemplary embodiment of the present invention, since the bit lines 36 are formed only in the first trenches 31 and the bit line spacers 35 are filled in the second trenches 33, even if the critical dimension of the bit lines 36 is increased, the contact area between the storage node contact plugs 29A and 29B and the active regions 23 does not decrease. For example, even when the critical dimension of the first trenches 31, where the bit lines 36 are formed, is increased, since the bottoms of the first trenches 31 do not reach the active regions 23, the contact area between the storage node contact plugs 29A and 29B and the active regions 23 does not decrease.

FIGS. 3A to 3J are cross-sectional views illustrating a method for manufacturing the semiconductor device in accordance with the first exemplary embodiment of the present invention.

Figure 3A:
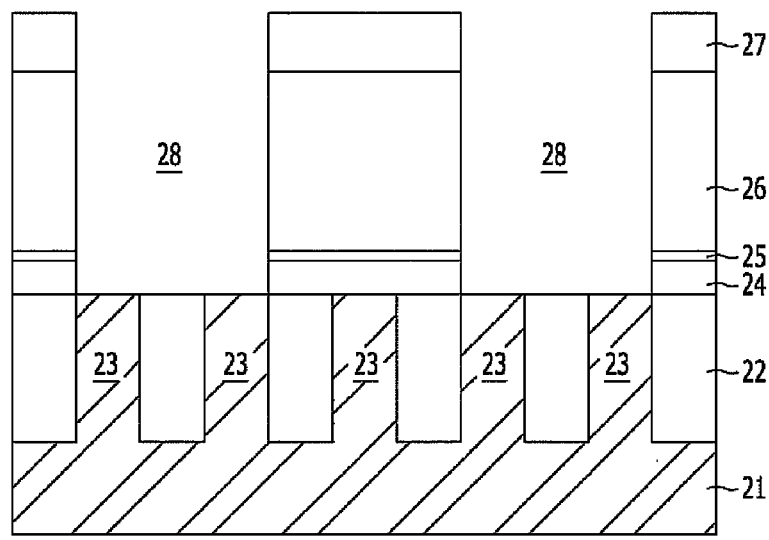
FIGS. 3A to 3J are cross-sectional views illustrating a method for manufacturing the semiconductor device in accordance with the first exemplary embodiment of the present invention.

Referring to FIG. 3A, an isolation layer 22 is formed in a semiconductor substrate 21. The isolation layer 22 is formed through a shallow trench isolation (STI) process well known in the art. Active regions 23 are defined by the isolation layer 22. While not shown, after forming the isolation layer 22, a process for forming buried gates BG may be performed. Since the buried gates BG are not shown in the cross-sectional view taken along the line A-A', a process for forming the buried gates BG may be performed as is generally known in the art.

Then, an interlayer insulating layer is formed on the surface of the semiconductor substrate 21 including the active regions 23. For example, as the interlayer insulating layer, a first interlayer insulating layer 24, an etch stop layer 25 and a second interlayer insulating layer 26 are stacked. The first interlayer insulating layer 24 and the second interlayer insulating layer 26 include silicon oxide layers such as borophosphosilicate glass (BPSG). The etch stop layer 25 includes a silicon nitride layer. The etch stop layer 25 serves as an etch stopper in a subsequent damascene process.

While not shown, before forming the interlayer insulating layer, landing plugs may be formed in such a way as to be connected with storage node contact plugs and bit lines. The landing plugs may be formed in such a way as to be self-aligned with the isolation layer 22. The landing plugs include a polysilicon layer. In another exemplary embodiment, the landing plugs may be formed before the isolation layer 22. For example, after forming a conductive layer for landing plugs, by etching the conductive layer through an STI process, the landing plugs are formed. Thereafter, by etching the semiconductor substrate 21 using the landing plugs as an etch barrier, trenches are defined, and the isolation layer 22 is formed to fill the trenches.

Next, a storage node contact mask 27 is formed on the second interlayer insulating layer 26. The storage node contact mask 27 is formed using a photoresist layer.

In succession, the second interlayer insulating layer 26, the etch stop layer 25 and the first interlayer insulating layer 24 are etched by using the storage node contact mask 27 as an etch barrier. As a result, dual storage node contact holes 28, each of which simultaneously opens adjacent active regions 23, are defined. The active regions 23, which are open by the dual storage node contact hole 28, correspond to storage node contact regions. The active regions 23 have the shapes of islands, and include storage node contact regions to contact storage node contact plugs and bit line contact regions to contact bit lines. Also, the active regions 23 further include gate regions between the storage node contact regions and the bit line contact regions, in which gates are formed. The gate regions as regions for the buried gates may have a trench structure.

Figure 3B:
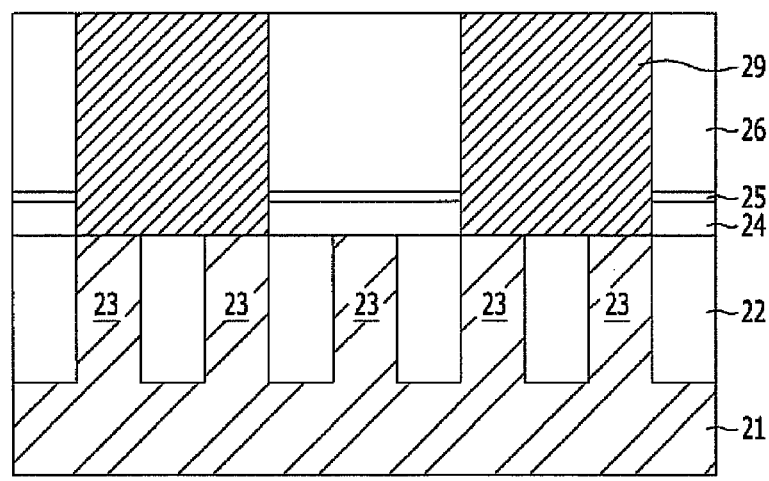

Referring to FIG. 3B, the storage node contact mask 27 is removed. Thereafter, preliminary storage node contact plugs 29 are formed in such a way as to fill the dual storage node contact holes 28. In order to form the preliminary storage node contact plugs 29, after depositing a polysilicon layer, chemical mechanical polishing (CMP) or etch-back is performed. Since each of the preliminary storage node contact plugs 29 is simultaneously connected with two adjacent active regions 23, they are also referred to as merged storage node contact plugs (merged SNC).

Figure 3C:
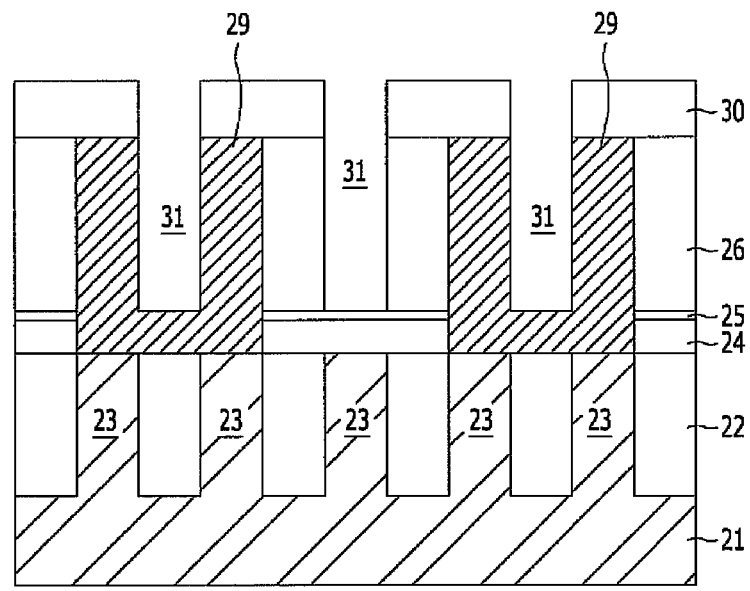

Referring to FIG. 3C, a damascene mask 30 for a damascene process is formed. The damascene mask 30 is a mask for dividing the preliminary storage node contact plugs 29 into individual storage node contact plugs and for forming damascene patterns used to form bit lines. The damascene mask 30 includes photoresist layer patterns or hard mask layer patterns. Hereinafter, the damascene mask 30 will be referred to as hard mask layer patterns 30. The hard mask layer patterns 30 include a nitride layer such as a silicon nitride layer.

A damascene process is performed by using the hard mask layer patterns 30 as an etch barrier. The damascene process include a primary etching process for defining first trenches, a secondary etching process for defining second trenches, and a tertiary etching process for etching the interlayer insulating layer. The primary etching process is a process for simultaneously etching the preliminary storage node contact plugs and the interlayer insulating layer, and the secondary etching process is a process for further etching the preliminary storage node contact plugs. A sacrificial spacer process is performed between the primary etching process and the secondary etching process.

Referring back to FIG. 3C, the preliminary storage node contact plugs 29 are etched and first trenches 31 are defined by the primary etching process. In the primary etching process, the preliminary storage node contact plugs 29 are not completely divided and instead are partially etched. Accordingly, the preliminary storage node contact plugs 29 remains under the bottom portions the first trenches 31. While performing the primary etching process, the interlayer insulating layer is also etched partially. For example, the second interlayer insulating layer 26 of the interlayer insulating layer is etched, and etching is stopped at the etch stop layer 25. The depth of the first trenches 31 may be controlled even without using a nitride layer for performing an etch stop function when forming the interlayer insulating layer.

Figure 3D:
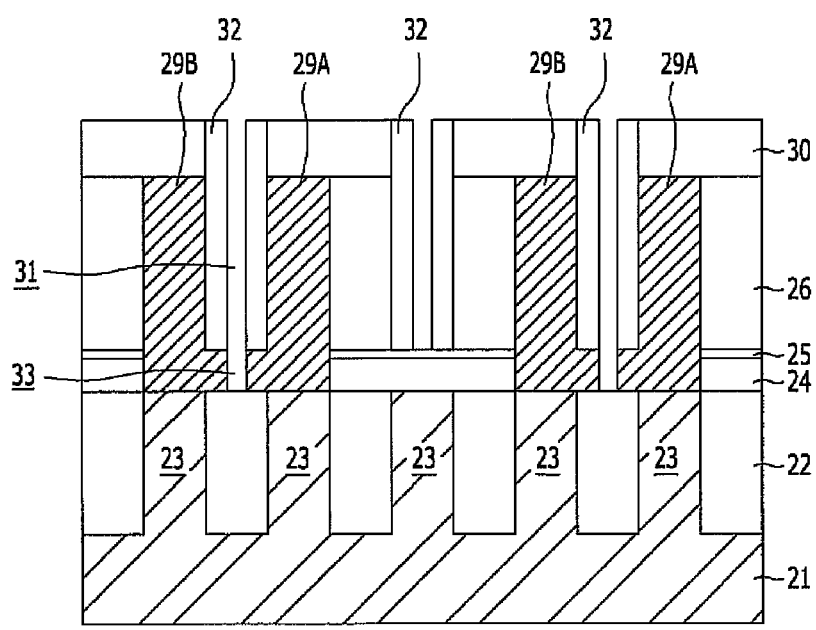

Referring to FIG. 3D, sacrificial spacers 32 are formed on both sidewalls of the first trenches 31. The sacrificial spacers 32 include an oxide layer. In order to form the sacrificial spacers 32, after depositing an oxide layer on the entire surface, an etch-back process is performed.

Then, the secondary etching process is performed. That is, the preliminary storage node contact plugs 29, which are positioned under the first trenches 31, are etched using the sacrificial spacers 32 as an etch barrier. According to this fact, second trenches 33 are defined in such a way as to divide the preliminary storage node contact plugs 29 into storage node contact plugs 29A and 29B which are individually independent.

Figure 3E:
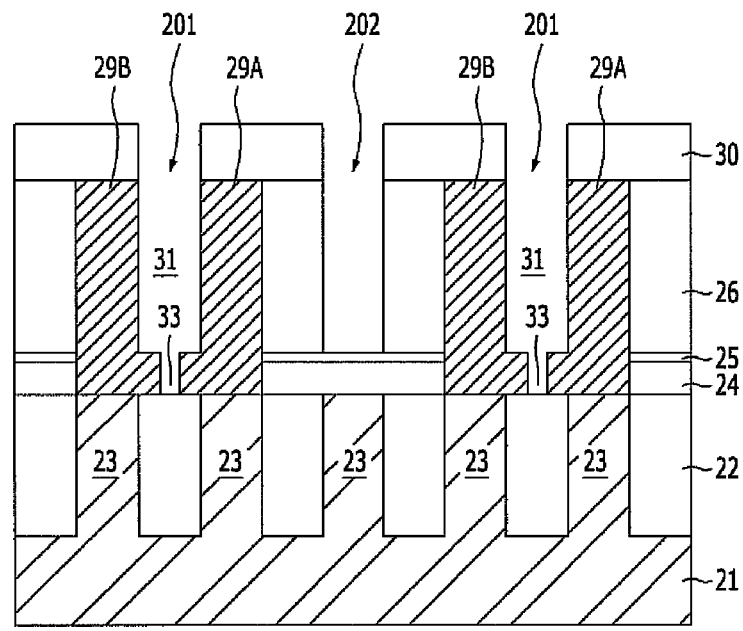

Referring to FIG. 3E, the sacrificial spacers 32 are removed.

Through a series of processes described above, first damascene patterns 201, which include the first trenches 31 and the second trenches 33, are formed. The first damascene patterns 201 divide the preliminary storage node contact plugs 29 into the independent storage node contact plugs 29A and 29B. The sidewalls of adjacent storage node contact plugs 29A and 29B, which face each other, have step shapes due to defining of the first and second trenches 31 and 33. Second damascene patterns 202 are formed in the bit line contact regions. The first damascene patterns 201 and the second damascene patterns 202 are connected in line shapes.

Figure 3F:
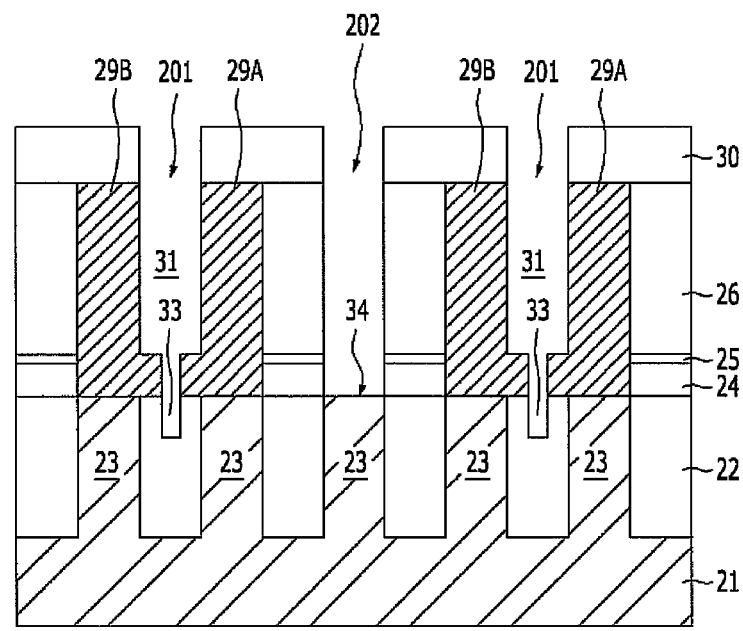

Referring to FIG. 3F, the tertiary etching process is performed. For example, the interlayer insulating layer under the second damascene patterns 202 is etched. The tertiary etching process etches the etch stop layer 25 and the first interlayer insulating layer 24. By this fact, the second damascene patterns 202 expose bit line contact regions 34 of the active regions 23 which are to be contacted by bit lines. When performing the tertiary etching process, the isolation layer 22 may be partially recessed under the first damascene patterns 201.

As can be readily seen from the above descriptions, the first damascene patterns 201 with a two-staged trench structure are formed between the storage node contact plugs 29A and 29B. The second damascene patterns 202 with a single-staged trench structure are formed in the regions where bit lines are to be formed. The critical dimension of the two-staged trench may be controlled by controlling the thickness of the sacrificial spacers 32 and may be minimized so long as a spacer insulating layer may be easily filled subsequently in the first damascene patterns 201.

Figure 3G:
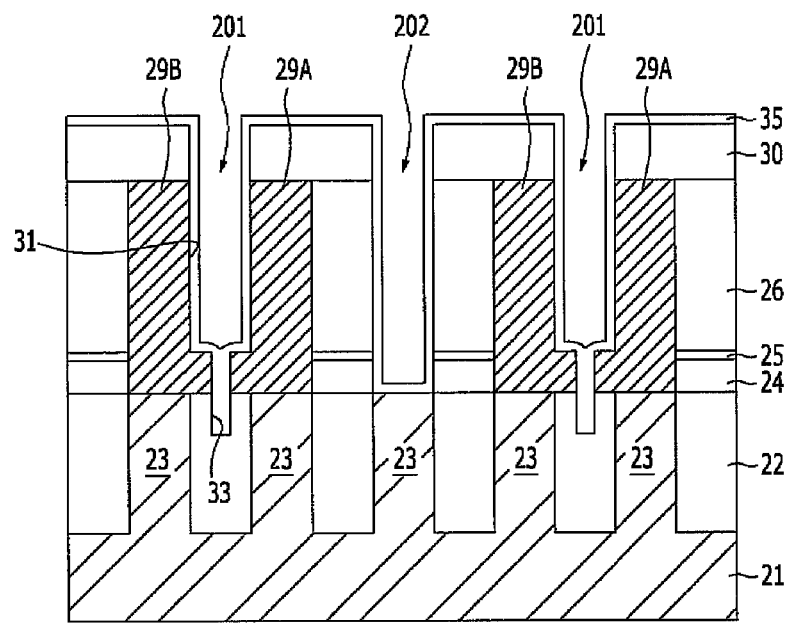

Referring to FIG. 3G, a spacer insulating layer 35 is formed on the entire surface including the first and second damascene patterns 201 and 202. The spacer insulating layer 35 includes an insulating layer such as a silicon nitride layer. Also, as the spacer insulating layer 35, a silicon oxide layer may be used. Furthermore, the spacer insulating layer 35 may include a combination of a silicon oxide layer and a silicon nitride layer, i.e., a double-layered stack or a triple-layered stack thereof.

The spacer insulating layer 35 is formed to a thickness that at least gap-fills the second trenches 33. The spacer insulating layer 35 is used as bit line spacers.

Figure 3H:
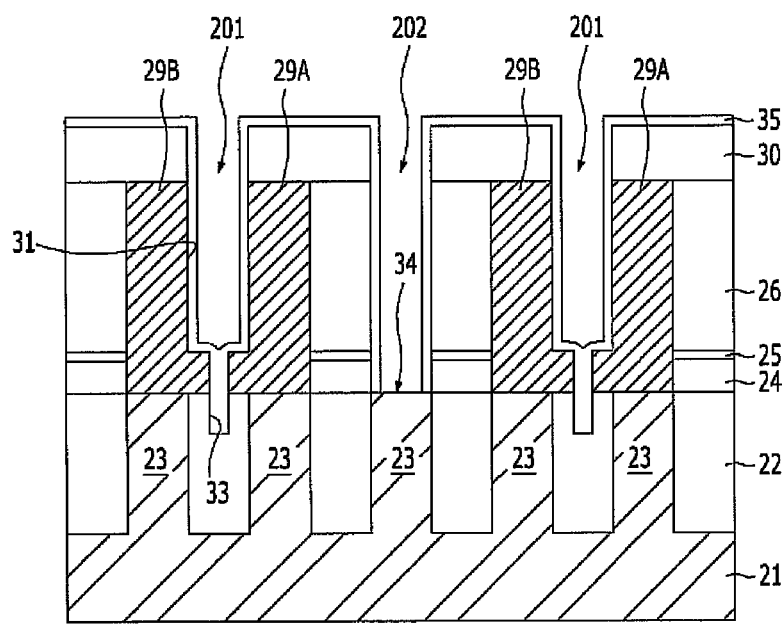

Referring to FIG. 3H, by selectively removing the spacer insulating layer 35, the surfaces of the active regions 23, which are to be contacted by bit lines, are exposed. That is, the bit line contact regions 34 are exposed. In order to expose the bit line contact regions 34, a bit line contact mask (not shown) may be used.

As the bit line contact regions 34 are exposed in this way, the spacer insulating layer 35 remains on the sidewalls and the bottoms of the first damascene patterns 201 and remains only on the sidewalls of the second damascene patterns 202. In other words, the spacer insulating layer 35 still gap-fills the second trenches 33 of the first damascene patterns 201. The spacer insulating layer 35 serves as bit line spacers. Hereafter, the spacer insulating layer 35 will be referred to as bit line spacer 35.

Figure 3I:
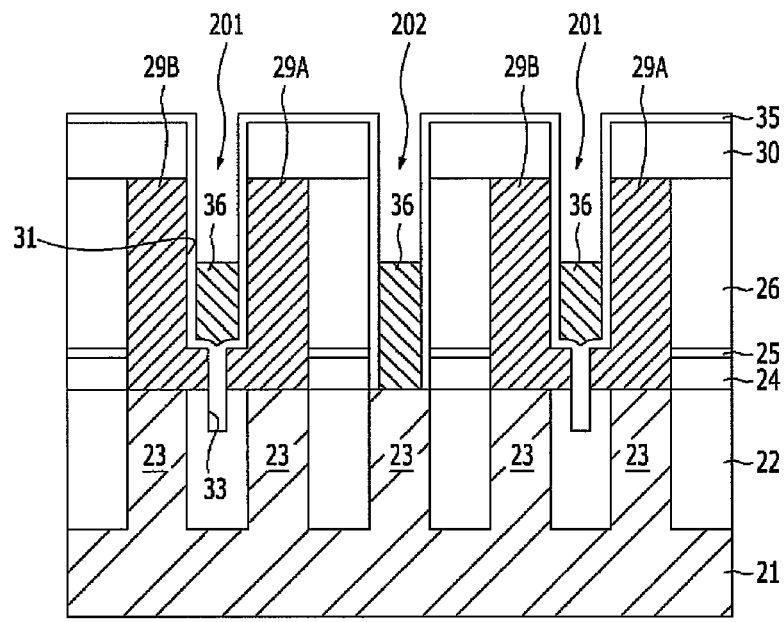

Referring to FIG. 3I, bit lines 36 are formed to partially fill the first and second damascene patterns 201 and 202 in which the bit line spacers 35 are formed.

In forming the bit lines 36, a conductive layer is formed on the entire surface to fill the first and second damascene patterns 201 and 202. Then, the conductive layer remains in the first and second damascene patterns 201 and 202 through a separate process such as CMP. Next, the conductive layer is recessed by a predetermined depth. In recessing the conductive layer, an etch-back process may be used.

The bit lines 36 include a barrier layer and a bit line metal layer. The bit line metal layer may be formed by using a metal such as tungsten. The barrier layer includes a titanium nitride layer. Before forming the barrier layer, an ion implantation process and a silicide process may be performed. The ion implantation process is a process for decreasing contact resistance, and the silicide process is a process for forming ohmic contacts.

Figure 3J:
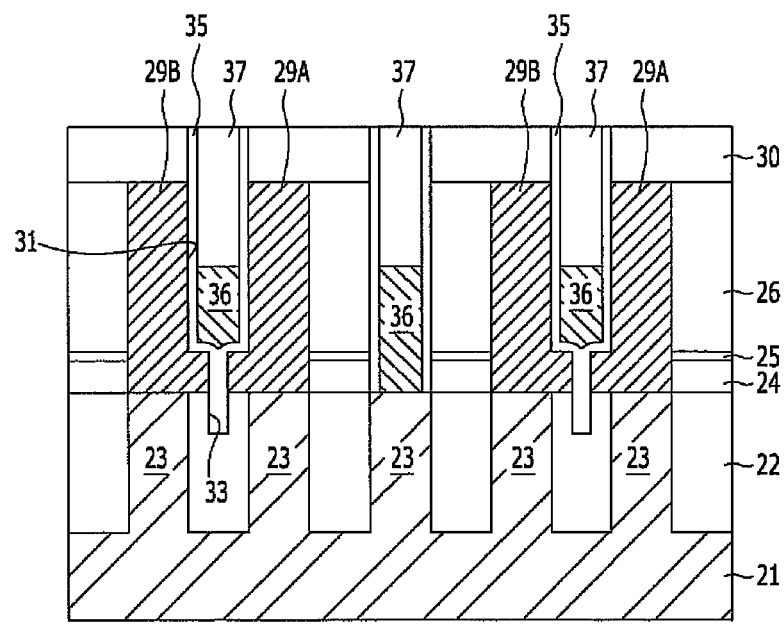

Referring to FIG. 3J, a bit line hard mask layer 37 is formed on the entire surface including the bit lines 36. The bit line hard mask layer 37 includes a nitride layer such as silicon nitride layer. Open portions of the first trenches over the bit lines 36 are gap-filled by the bit line hard mask layer 37.

Next, the bit line hard mask layer 37 is planarized. The planarization of the bit line hard mask layer 37 is performed with the target of exposing the surfaces of the hard mask layer patterns 30. The planarization uses a CMP process. By such planarization, the bit line hard mask layer 37 remains only on the bit lines 36.

Figure 4:
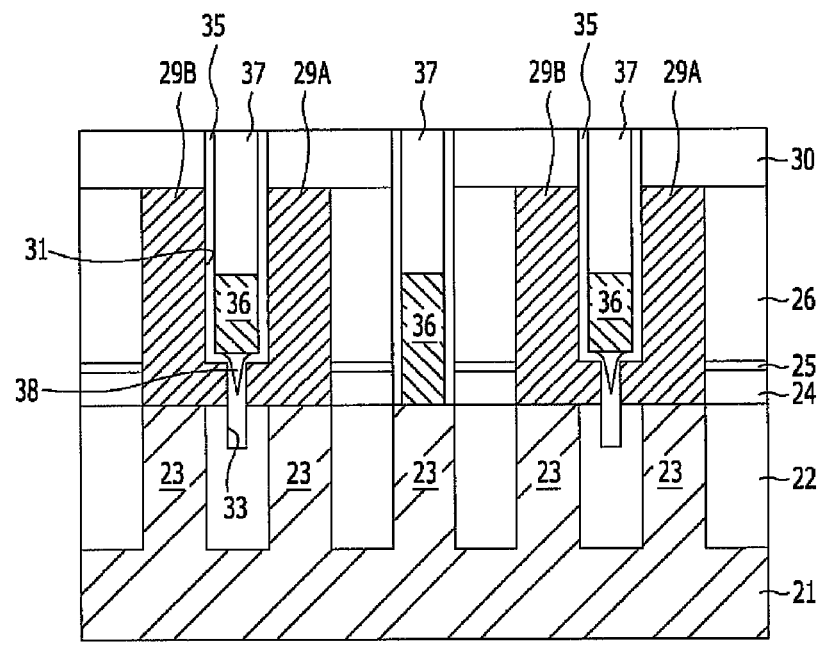
FIG. 4 is a cross-sectional view illustrating a semiconductor device in accordance with a second exemplary embodiment of the present invention.

FIG. 4 is a cross-sectional view illustrating a semiconductor device in accordance with a second exemplary embodiment of the present invention.

Referring to FIG. 4, the semiconductor device in accordance with this second exemplary embodiment of the present invention is similar to the first embodiment except that, in the case where second trenches 33 are not completely gap-filled when forming a spacer insulating layer 35, the second trenches 33 are gap-filled by using an additional gap-fill insulating layer 38. The remaining processes excluding the process for forming the additional gap-fill insulating layer 38 are performed in the same manner as those of the first embodiment. The additional gap-fill insulating layer 38 includes an oxide layer or a nitride layer.

Figure 5:
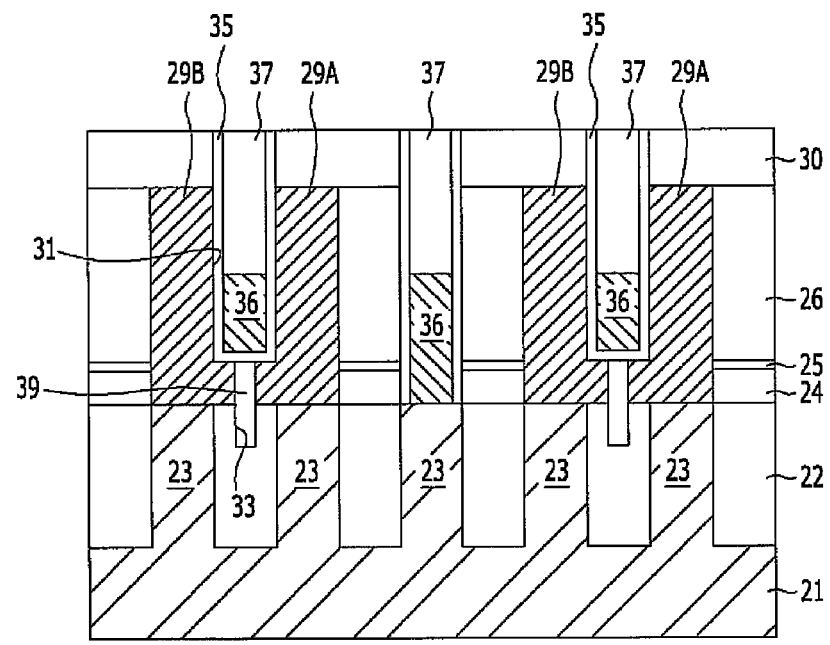
FIG. 5 is a cross-sectional view illustrating a semiconductor device in accordance with a third exemplary embodiment of the present invention.

FIG. 5 is a cross-sectional view illustrating a semiconductor device in accordance with a third exemplary embodiment of the present invention.

Referring to FIG. 5, the semiconductor device in accordance with this third exemplary embodiment of the present invention is similar to the first embodiment except that second trenches 33 are gap-filled by a gap-fill insulating layer 39 before forming a spacer insulating layer 35. The remaining processes excluding the process for forming the gap-fill insulating layer 39 are performed in the same manner as those of the first embodiment. The gap-fill insulating layer 39 includes an oxide layer or a nitride layer.

According to the second and third exemplary embodiments, the gap-fill insulating layer 38 or 39 is filled in the second trenches 33 and the bit lines 36 are not deposited in the second trenches 33. As a result, the overlap area, through which storage node contact plugs 29A and 29B and the bit lines 36 face each other, decreases. Thus, even when the height of bit lines 36 is increased to secure bit line resistance as the critical dimension of the bit lines 36 decreases, the capacitance between the storage node contact plugs 29A and 29B and the bit lines 36 may be decreased.

Furthermore, due to the fact that the bit lines 36 are formed only in first trenches 31 and the gap-fill insulating layer 38 or 39 is filled in the second trenches 33, even when the critical dimension of the bit lines 36 increases, the contact area between the storage node contact plugs 29A and 29B and active regions 23 does not decrease. For example, even when the critical dimension of the first trenches 31, in which the bit lines 36 are formed, is increased, since the bottoms of the first trenches 31 do not reach the active regions 23, the contact area between the storage node contact plugs 29A and 29B and the active regions 23 does not decrease.

In accordance with the exemplary embodiments of the present invention, since an insulating layer is gap-filled in a lower trench of a two-staged trench and an area between a bit line and a storage node contact plug is decreased, it may be possible to significantly decrease capacitance between the bit line and the storage node contact plug without loss of bit line resistance.

Furthermore, in the exemplary embodiments of the present invention, since a gap between the lower parts of storage node contact plugs may be decreased, the contact area between the storage node contact plug and an active region may be maximized, whereby occurrence of a fail in a semiconductor device due to resistance of the storage node contact plug may be effectively decreased.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   first conductive patterns adjacent to each other and isolated by a trench including first and second trenches;
   a second conductive pattern formed in the first trench; and
   an insulating pattern fully filling the second trench under the second conductive pattern and formed between the first conductive patterns and the second conductive pattern,
   wherein the second trench is defined under the first trench, has a critical dimension smaller than that of the first trench and extends into an isolation layer formed in a substrate,
   wherein the second conductive pattern includes a protruded portion directly contacted to an active region formed in the substrate and defined by the isolation layer,
   wherein the second conductive pattern extends in a first direction and the protruded portion is protruded in a second direction which is perpendicular to the first direction.

2. The semiconductor device of claim 1, wherein the second trench is defined under the first trench and has a critical dimension gradually decreasing toward a bottom thereof.

3. The semiconductor device of claim 1, wherein the insulating pattern comprises a first insulating pattern formed under the second conductive pattern and a second insulating pattern formed between the first conductive patterns and the second conductive pattern, and
   wherein the first insulating pattern has a critical dimension smaller than that of the second conductive pattern.

4. The semiconductor device of claim 1, wherein the insulating pattern comprises a first insulating pattern formed on a bottom and sidewalls of the trench and a second insulating pattern formed between the second conductive pattern and the first insulating pattern.

5. A semiconductor device comprising:
   a pair of adjacent plugs isolated by a trench including first and second trenches;
   a bit line formed in the first trench; and
   an insulating layer fully filling the second trench under the bit line and formed between the adjacent plugs and the bit line,
   the second trench is defined under the first trench, has a critical dimension smaller than that of the first trench and extends into an isolation layer formed in a substrate,
   wherein the bit line includes a protruded portion directly contacted to an active region formed in the substrate and defined by the isolation layer,
   wherein the bit line extends in a first direction and the protruded portion is protruded in a second direction which is perpendicular to the first direction.

6. The semiconductor device of claim 5, wherein the second trench is defined under the first trench and has a critical dimension gradually decreasing toward a bottom thereof.

7. The semiconductor device of claim 5, wherein the insulating layer comprises a first insulating layer formed on a bottom and sidewalls of the trench and a second insulating layer formed between the bit line and the first insulating layer.

8. The semiconductor device of claim 7, wherein the first insulating layer comprises a nitride layer, and the second insulating layer comprises an oxide layer or a nitride layer.

9. The semiconductor device of claim 5, wherein the isolation layer isolates adjacent active regions.

10. The semiconductor device of claim 9, wherein the adjacent plugs include storage node contact plugs formed over the active regions and isolated by the trench.

11. The semiconductor device of claim 5, wherein the bit line is filling the first trench over the insulating layer.

12. The semiconductor device of claim 5, wherein the second trench is defined under the first trench and has a critical dimension gradually decreasing toward a bottom thereof.

13. The semiconductor device of claim 5, wherein the insulating layer comprises a first insulating layer formed on a bottom and sidewalls of the first trench and a second insulating layer formed under the bit line and the first insulating layer.

14. The semiconductor device of claim 1, wherein the insulating pattern has a thickness that gap-fills the second trench.

15. The semiconductor device of claim 5, wherein the insulating pattern has a thickness that gap-fills the second trench.

16. The semiconductor device of claim 1, wherein the protruded portion is not overlapped with the first conductive patterns.

17. The semiconductor device of claim 3, wherein the isolation layer isolates adjacent active regions, the first insulating pattern is formed in the first conductive patterns and the isolation layer.

18. The semiconductor device of claim 5, wherein the protruded portion is not overlapped with the adjacent plugs.

19. The semiconductor device of claim 9, wherein the insulating layer in the second trench is formed in the plugs and the isolation layer.

* * * * *